US008222898B1

(12) United States Patent
Edelstein

(10) Patent No.: US 8,222,898 B1
(45) Date of Patent: Jul. 17, 2012

(54) METHOD AND APPARATUS FOR UTILIZING MAGNETIC FIELD MODULATION TO INCREASE THE OPERATING FREQUENCY OF SENSORS

(75) Inventor: Alan Shane Edelstein, Alexandria, VA (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 13/236,852

(22) Filed: Sep. 20, 2011

Related U.S. Application Data

(60) Provisional application No. 61/475,958, filed on Apr. 15, 2011.

(51) Int. Cl.
*G01R 33/02* (2006.01)
*G01R 33/06* (2006.01)
(52) U.S. Cl. .................. 324/244; 324/249; 324/260
(58) Field of Classification Search .............. 324/244, 324/249, 260
See application file for complete search history.

(56) References Cited

U.S. PATENT DOCUMENTS

| | | | |
|---|---|---|---|
| 6,316,939 B1 * | 11/2001 | Nakagawa et al. ....... 324/253 |
| 6,501,268 B1 | 12/2002 | Edelstein et al. | |
| 6,670,809 B1 | 12/2003 | Edelstein et al. | |
| 7,023,206 B2 | 4/2006 | Viehland et al. | |
| 7,046,002 B1 | 5/2006 | Edelstein | |
| 7,185,541 B1 | 3/2007 | Edelstein | |
| 7,195,945 B1 | 3/2007 | Edelstein | |
| 7,655,996 B1 | 2/2010 | Edelstein | |
| 7,771,846 B2 | 8/2010 | Viehland et al. | |
| 7,898,247 B2 | 3/2011 | Edelstein et al. | |
| 2010/0039106 A1 | 2/2010 | Edelstein | |

OTHER PUBLICATIONS

S. M. Gillette, et al. "Improved Sensitivity and Noise in Magneto-Electric Magnetic Field Sensors by Use of Modulated AC Magnetostriction" IEEE Magnetics Letters, vol. 2 (published Jun. 7, 2011) 2500104.
S. K. Mandal, et al. "Flexural deformation in a compositionally stepped ferrite and magnetoelectric effects in a composite with piezoelectrics,"Appl. Phys. Lett. 96, 192502 (May 10, 2010).
S. K. Mandal, et al., "Magnetization-graded Multiferroic Composite and Magnetoelectric Effects at Zero Bias," Phys. Rev. B 84, 014432 (published Jul. 29, 2011).
O'Handley, Robert, "Modern Magnetic Materials: Principles and Applications," p. 222, (2000).
Zhai, J., et al., "Magnetoelectric Laminate Composites: An Overview," J. American Ceramic Soc., 2008. 91(2): p. 351-358.

(Continued)

*Primary Examiner* — Reena Aurora
(74) *Attorney, Agent, or Firm* — Lawrence E. Anderson

(57) ABSTRACT

A system for modulating a magnetic field sensor device comprising: a base; a magnetic sensor comprising a plurality of magnetic components; at least one coil for creating a magnetic field around the magnetic sensor; the at least one coil adapted to be connected to an alternating current source that passes through the coil to modulate the magnetic field at the magnetic sensor and drive at least one of the magnetic components of the magnetic sensor into and out of its region of increased magnetic response while shifting the frequency of the magnetic field that is sensed by the magnetic sensors a higher frequency to thereby minimize 1/f-type noise, where f is the frequency of operation of the magnetic sensor. The method comprises forming at least one coil around the magnetic sensor; connecting the coil to an alternating current power source; and modulating the current from the power source.

20 Claims, 12 Drawing Sheets

OTHER PUBLICATIONS

Edelstein, A.S., et al., "Progress toward a thousandfold reduction in 1/f noise in magnetic sensors using an ac microelectromechanical system flux concentrator," J. Appl. Phys., 2006. 99: p. 08B317/1-6.

Egelhoff, W.F.J., et al., "Critical challenges for picoTesla magnetic-tunnel-junction sensors," Sensors and Actuators A, 2009. 155: p. 217.

Wang, W. and Z. Jiang, "Thermally Modulated Flux Concentrator for Minimizing 1/f Noise in Magnetoresistance-Based Field Sensors," IEEE Trans. Magnetics, 2008. 44: p. 4003.

Ripka, P. and M. Janosek, "Advances in Magnetic Field Sensors," IEEE Sensors Journal, 2010. 10: p. 1108.

Ripka, P., "Review of fluxgate sensors," Sensors and Actuators: A Phyisical, 1992. 33: p. 129.

M.D. Mermelstein and A. Dandridge, "Low-frequency magnetic field detection with a magnetostrictive amorphous metal ribbon," Applied Physics Letters, 1987. 51(7): p. 545-547.

A. Pantinakis and D.A. Jackson, "Limitations of an amorphous-metal magnetometer operated by modulating the magnetostrictive strain," Journal of Applied Physics, 1989. 65(7): p. 2872-2874.

M. Doerr, M. Rotter, and A. Lindbaum, "Magnetostriction in rare-earth based antiferromagnets" Advances in Physics, 2005. 54(1): p. 1-66.

J.F. Janak and A.R. Williams, "Giant internal magnetic pressure and compressibility anomalies," Physical Review B, 1976. 14(9): p. 4199.

* cited by examiner

MAGNETOELECTRIC SENSOR AND COIL

Asymmetric

FIG. 4 MAGNETOELECTRIC SENSOR AND COIL
symmetric

SCHEMATIC GRAPH OF DEFORMATION DUE TO
MAGNETOSTRICTION AS A FUNCTION OF FIELD INTENSITY

METHOD AND APPARATUS FOR UTILIZING MAGNETIC FIELD MODULATION TO INCREASE THE OPERATING FREQUENCY OF SENSORS

CROSS REFERENCE TO RELATED APPLICATIONS

The application claims priority to Provisional Application No. 61/475,958 filed Apr. 15, 2011, entitled 'Method and Apparatus for Utilizing Magnetic Field Modulation to Increase the Operating Frequency of Sensors," hereby incorporated by reference.

GOVERNMENT INTEREST

The invention described herein may be manufactured, used, and/or licensed by or for the United States Government.

FIELD OF THE INVENTION

This invention relates generally to sensors, more particularly to magnetic field modulations of magnetic sensors.

BACKGROUND OF THE INVENTION

Pursuant to 35 U.S.C. §103(c)(2), the claimed invention was made by an employee of a party to a joint research agreement and as a result of activities undertaken within the scope of the joint research agreement. The parties to the joint research agreement were Virginia Polytechnic Institute & State University and the United States Air Force (U.S. Government).

Methods of modulating the magnetic field in micron-sized magnetic sensors have been disclosed for example in U.S. Pat. No. 6,501,268. U.S. Pat. No. 7,898,247 discloses a method based on using a rotating disc containing flux concentrators and guides which can be used with a larger sensor, but the motion of the rotating disk generates considerable acoustic noise. Fluxgate magnetometers operate using a similar principle to the one described here in that they drive magnetic material (in the case of a fluxgate a magnetic core) into and out of saturation.

Magnetoelectric magnet field sensors are disclosed in U.S. Pat. No. 7,023,206 to Viehland, et al., (hereinafter Viehland '206) issued Apr. 4, 2006, entitled "Magnetoelectric Magnetic Field Sensor with Longitudinally Biased Magnetostrictive Layer," hereby incorporated by reference. Viehland '206 discloses a magnetoelectric magnetic field sensor having one or more laminated magnetostrictive layers and piezoelectric layers. The magnetostrictive layers are magnetized by a bias magnetic field in a longitudinal, in-plane direction. The piezoelectric layers can be poled in the longitudinal direction or perpendicular direction. For example, an L-P configuration represents a longitudinal MS magnetization combined with perpendicular PZ poling. Perpendicular poling of the piezoelectric layers tends to provide higher sensitivity at lower detection frequency (e.g. less than 1 Hz). Longitudinal poling tends to provide higher sensitivity at high detection frequency (e.g. above 10 Hz). Also disclosed in Viehland '206 are embodiments having relative thicknesses for the magnetostrictive layers that are optimized for sensitivity. Further examples of a magnetoelectric sensor are disclosed in U.S. Pat. No. 7,771,846 to Viehland, et al., (Viehland '846) hereby incorporated by reference. Viehland '846 discloses a magnetoelectric composite laminate of at least one (1-3) piezo-fiber layer coupled with high-permeability alloy magnetostrictive layers formed of FeBSiC or equivalent. The composite laminate alternates the (1-3) piezo-fiber and high-permeability alloy magnetostrictive layers in a stacked manner with the magnetization direction of the high-permeability alloy magnetostrictive layers and polarization direction of the piezo-fiber layer being in an longitudinal-longitudinal (L-L) arrangement. Optionally, thin film polymer layers are between the (1-3) piezo-fiber layer and high-permeability alloy magnetostrictive layers. Optionally, piezo-electric fibers within the (1-3) piezo-fiber layer are poled by interdigitated electrodes supported by the thin film polymer, arranged as alternating symmetric longitudinally-poled "push-pull" units.

There is a need for better performance of sensors, such as for example magnetoelectric magnetic field sensors, at low frequencies to detect weapons systems, vehicles, and, in general, ferromagnetic objects. Also, there is a need for improved magnetic sensors that can be use for controlling manufacturing processes, checking that the hearts of unborn babies for proper functioning, and, if nanomagnets are included as part of a drug, monitoring drug circulation through the bodies of patients.

SUMMARY OF THE INVENTION

The present invention is directed to a field modulation technique that increases the operating frequency of magnetoelectric (ME) sensors so that it has the capability of matching the mechanical resonance frequency of the sensor or alternatively solely increases the operating frequency. The resulting improvement reduces the effect of 1/f noise that is inherent at low frequencies and may also improve the sensitivity by operating at the resonant frequency, where the sensor has a larger response. This technique, which is shown to apply to both symmetric and asymmetric ME sensors, relies on the strong, nonlinear magnetic field dependence of the magnetostriction. The combination of a lower 1/f noise and the capability of enhanced response at resonance has increased the signal to noise ratio of a symmetric sensor by two orders of magnitude and lowered its detection limit to 7 pT/$\sqrt{Hz}$ at 1 Hz in a magnetically unshielded environment.

A preferred embodiment comprises a magnetoelectric sensor assembly 10 comprising three magnetic materials as shown in FIG. 1. The layers may comprise magnetostrictive material (such as Metglas®) layer 1, a biasing ferromagnetic material 2, and a piezoelectric material 3. The assembly 10 may optionally comprise flux concentrators 4 and 5. The ferromagnetic material layer 2 provides a bias field for the magnetostrictive material and is optional. The embodiment of FIG. 1 is asymmetric in that it has a Metglas® layer positioned on one side of the ferromagnetic material 2, and a piezoelectric layer 3 on the opposite side of ferromagnetic layer 2.

As shown in FIG. 1, the preferred embodiment assembly 10 comprises at least one coil 6 positioned as shown. When two coils are used, both coils have their field direction along the sense direction of the sensor. At least one or more coils 6 can be used to apply a DC field to bias the sensor; which affords the opportunity to remove the bias layer 2 from the assembly 10. An AC magnetic field that is large enough in magnitude is used to drive one or several of the magnetic components of the sensor into and out of a region of increased magnetic response at a frequency $f_m$. Alternately to coils, a magnet(s) parallel to the sensor can be repeatedly cycled at $f_m$ to different positional offsets from the sensor. The stray fields will have a DC bias component and an AC field component at $f_m$. In all instances, the modulating frequency operates to modulate the amplitude of the signal output of the sensor (the sensed signal). When the components, e.g., the flux concentrator (4,5), the biasing layer 2, and/or the magnetostrictive material (Metglas®) layer 1, are in the region of increased magnetic response, the sensor will be much less sensitive. Thus, either the field sensed due to changing the flux concentrator will be modulated at $f_m$ or the output amplitude of the sensor will be modulated at $f_m$ if the biasing magnet or magnetostrictive material is driven into and out of their region of increased magnetic response. In any case, the operating frequency of the sensor will be increased to higher frequencies; reducing 1/f noise inversely proportional to frequency. A further possible advantage is that one can increase the frequency to particular frequencies where some sensors are more sensitive. Magnetoelectric sensors have increased sensitivity at their mechanical resonant frequency modes $f_r$. For example, when detecting a low frequency signal $f_s$, the coil is driven at $f_m$ sidebands appear at $f_m \pm f_s$. The modulation frequency $f_m$ can be picked for driving the magnetic material into and out of saturation so that one of the sidebands is at the resonant frequency, i.e., $$f_r = f_m - f_s \text{ or } f_r = f_m + f_s \quad (1)$$

An example of this is shown in FIG. 3, wherein sideband 7 (occurring at resonant frequency of 138.70 hertz is shown. The sidebands are proportional to the sensed signal. Specifically, the amplitude of each sideband is proportional to the intensity of the sensed (or measured) signal. Thus, measurements may be obtained or derived using the sidebands.

Another preferred embodiment modulating magnetic field sensor device may comprise a base; a magnetic sensor operatively associated with the base structure for sensing a magnetic field; at least one coil for creating a magnetic field around the magnetic sensor; at least one coil adapted to be connected to an alternating current source; whereby alternating current passing through the coil operates to modulate the magnetic field at the magnetic sensors and shift the frequency of the magnetic field that is sensed by the magnetic sensors to a higher frequency to thereby minimize 1/f-type noise, where f is the frequency of operation of the magnetic sensor. Optionally, the device may comprise a flux concentrator on one side or both sides of said magnetic sensor.

Another preferred embodiment magnetoelectric sensor 10A comprises two layers comprising a magnetostrictive material, such as, Metglas® 1 surrounding a piezoelectric material 2. The biasing ferromagnet layer 3 may be positioned as shown in FIG. 4 or a secondary DC coil may be used as explained in the following. The embodiment of FIG. 4 is symmetric in that the magnetostrictive material layers are positioned on both sides of the piezoelectric material 2.

The invention further comprises a method of operating a magnetic sensor comprising at least one coil around the magnetic sensor; connecting the at least one coil to an alternating current power source; and modulating the current from the power source to drive at least one of the magnetic sensor components into and out of saturation.

BRIEF DESCRIPTION OF THE DRAWINGS

The present invention can best be understood when reading the following specification with reference to the accompanying drawings, which are incorporated in and form a part of the specification, illustrate alternate embodiments of the present invention, and together with the description, serve to explain the principles of the invention. In the drawings.

Figure 1:
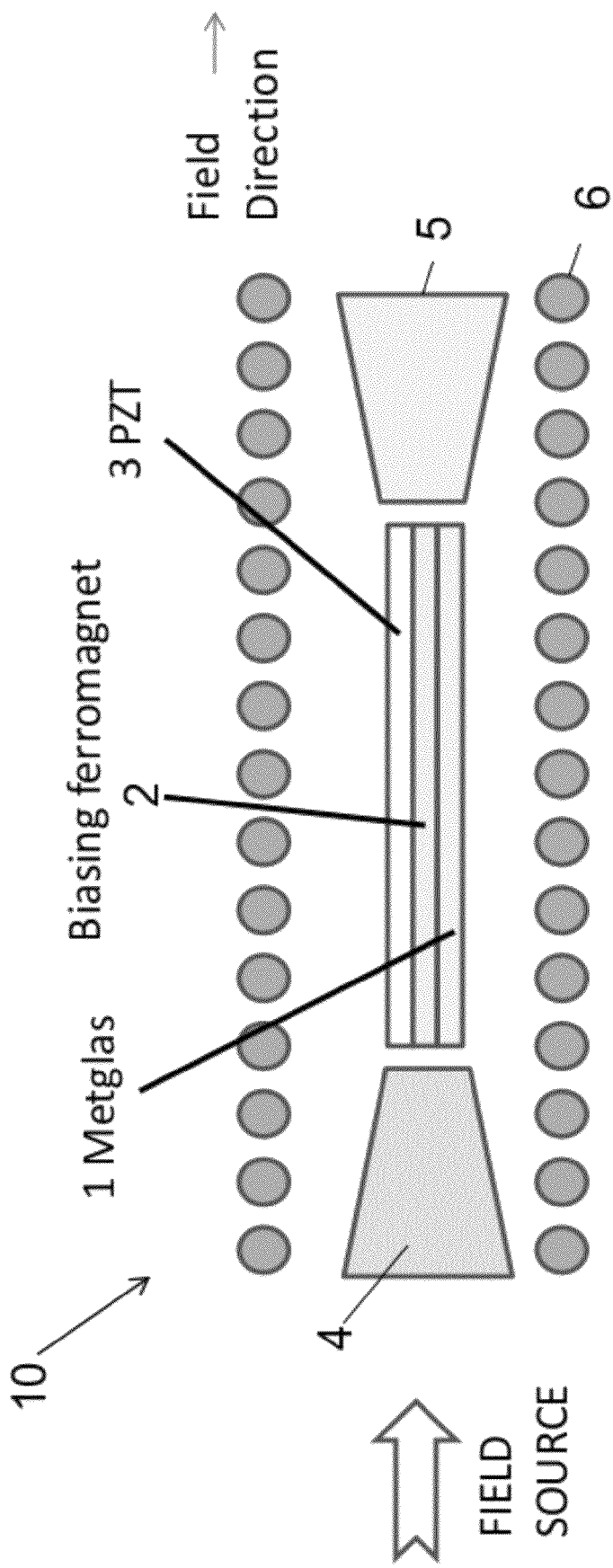
FIG. 1 is a schematic drawing of a preferred embodiment comprising a magnetoelectric sensor and a coil.

A more complete appreciation of the invention will be readily obtained by reference to the following Description of the Preferred Embodiments and the accompanying drawings in which like numerals in different figures represent the same structures or elements. The representations in each of the figures are diagrammatic and no attempt is made to indicate actual scales or precise ratios. Proportional relationships are shown as approximates.

DETAILED DESCRIPTION OF THE PREFERRED EMBODIMENTS

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. Like numbers refer to like elements throughout. As used herein the term "and/or" includes any and all combinations of one or more of the associated listed items.

The terminology used herein is for the purpose of describing particular embodiments only and is not intended to limit the full scope of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that is farthest away from a substrate.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

Magnetoelectric (ME) sensors are generally passive sensors with sensitivities that are generally better than all but the most expensive, current sensors. Generally, ME sensors are composed of layers of mechanically-coupled magnetoelectric and magnetostrictive material. In a magnetic field, the magnetostrictive material exerts a stress on the piezoelectric material, which in turn generates a charge.

As used in the following description of the preferred embodiments, the geometry of the layers in a ME sensor may be symmetric (e.g., Metglas-PZT-Metglas trilayer) or asymmetric (such as for example, Metglas-PZT bilayer) about a central plane parallel to the layers. Because their output depends on the amount of strain, larger ME sensors with centimeter dimensions tend to have greater sensitivity. These ME sensors also have increased sensitivity at their mechanical resonant modes, where the transfer of magnetostrictive strain to the piezoelectric laminate is enhanced. The longitudinal, resonant frequency of such symmetric ME sensors is of order 10 or more kHz. The bending, resonant mode of such unloaded asymmetric sensors in a cantilever configuration is often in the range of hundreds of Hz. ME sensors experience 1/f noise that hampers their ability to detect fields at frequencies below several Hz. It is desirable to shift the operating frequency to a higher value where this noise is lower. There are instances, depending upon the noise, when the signal to noise ratio would be further improved if this shifted, higher operating frequency is equal to the resonant frequency where the ME sensors are more sensitive.

A preferred embodiment comprises a magnetoelectric sensor 10 comprising three magnetic materials as shown in FIG. 1. The layers may comprise magnetostrictive material such as Metglas® 1, a biasing ferromagnet 2, and a piezoelectric material 3. The amorphous alloy with the trade name Metglas 2605SC® has the composition $Fe_{81}Si_{3.5}B_{13.5}C_2$. Favorable properties of this material are its high saturation magnetostriction constant, λ, of about 20 ppm and more, coupled with a low magnetic anisotropy field strength, HA, of less than 1 kA/m (to reach magnetic saturation). Metglas 2605SC® also exhibits a very strong magnetoelastic effect with reductions in the effective Young's modulus up to about 80% in bulk. The alloy(s) that exhibit the highest known magnetostriction is Terfenol-D, (Ter for terbium, Fe for iron, NOL for Naval Ordnance Laboratory, and D for dysprosium). Terfenol-D, $Tb_xDy_{1-x}Fe_2$, exhibits a uniaxial magnetostriction constant of about 2,000 ppm in a field of 2 kOe at room temperature and is believed to be the most commonly used engineering magnetostrictive material. The element that exhibits the largest room temperature magnetostriction of a pure element at 60 ppm is Cobalt. PZT, which is lead zirconate titanate (Pb $[Zr_xTi_{1-x}]O_3$ $0 \leq x \leq 1$), is a commonly used piezoelectric ceramic. Other ceramics with perovskite or tungsten-bronze structures that exhibit piezoelectricity are Barium titanate ($BaTiO_3$), lead titanate ($PbTiO_3$), Potassium niobate ($KNbO_3$), and Lithium niobate ($LiNbO_3$).

Magnetostrictive materials require a biasing field because their response to a magnetic field is essentially zero in with no magnetic field H=0. If the biasing magnet (layer) 2 is not present, a biasing field must be provided in some other way such as a more distant magnet or by coil. The magnetostrictive material surface (surface of layer 1) and piezoelectric material surface (surface of layer 3) are mechanically constrained to move together at their interface. Thus, it can be appreciated that the stress of the magnetostrictive material in a magnetic field results in strain in the piezoelectric material that has the ability to transform mechanical energy from the magnetostrictive material into an electrical output; which generates an electric field; which comprises the output of the sensor.

The system has both inertia against movement and restoring forces that facilitate the return of the system to its undisturbed equilibrium position. When the system is driven to move at certain normal mode frequencies, the amplitude of the motion is large. A simple example of resonance occurs if one considers the motion of a mass m connected to a spring with spring constant k. The amplitude of the motion is greatest at the frequency f.

$$f = \frac{1}{2\pi}\sqrt{\frac{k}{m}}$$

where m is the mass and k is the spring constant. For a mechanical system, such as the magnetoelectric sensor, the normal modes of resonant frequencies depend on the geometry, the mass, and the stiffness of the materials. For example, increasing the length and decreasing the stiffness of the material will decrease the resonant frequency. In setting up the system, the frequency of the field to be sensed is a consideration used in order to determine the resonant frequency of the sensor $f_r$.

The magnetic materials comprise the magnetostrictive material, often Metglas®, flux concentrators 4 and 5, often permalloy, and possibly a ferromagnetic material such as Ni that provides a bias field for the magnetostrictive material.

The dimensions of the components in FIG. 1 may be as follows (where $D_C$ is the coil diameter, $L_s$, $T_s$, and $W_s$ are the length, thickness and width of the sensor:

Examples of Dimensions $D_C$=range of roughly couple millimeters to several centimeters.

$L_s$=range of roughly couple millimeters to several centimeters.

$T_s$=on the order of a couple hundred microns.

$W_s$=(width of the sensor) on the order of a centimeter.

Number of turns in coil on the order of 50-100; which depends upon the current which may range from 100 mA to approximately 3 Amps.

As shown in FIG. 1, the preferred embodiment comprises at least one coil 6 as shown in FIG. 1. When two coils are used, both coils have their field direction along the sense direction of the sensor. One coil 6 can be used to apply a dc field to bias the magnetostrictive material; which affords the opportunity to remove the bias layer from the sensor. The other coil provides an AC magnetic field at a frequency $f_m$ that is large enough in magnitude to drive one or several of the magnetic components of the sensor into and out of magnetic saturation.

The field supplied by the coil 6 does not interfere with the sensing operation because the frequencies are different. The frequencies in the coil 6 are roughly 100 Hertz or above. The frequencies of the field to be sensed are roughly 10 Hertz or below. The system will operate as describe herein if the sense frequency is less than the coil frequency. Though the coil 6 is described as operating to drive the materials in components (flux concentrator, magnetorestrictive material and biasing magnet) into and out of saturation, just driving any one of the flux concentrator, the magnetorestrictive material, or the biasing magnet beyond the linear range will create additional peaks. The sidebands represent the increased frequency of the signal due to the coil driving the materials into the nonlinear region or into and out of saturation.

When a component, e.g., the flux concentrator (4,5), the biasing magnet 3, and/or the magnetostrictive material (Metglas® 1), is saturated, the sensor will be much less sensitive. Thus, either the field sensed due to saturating the flux concentrator will be modulated at $f_m$ or the output amplitude of the sensor will be modulated at $f_m$ if the biasing magnet or magnetostrictive material is driven into and out of saturation. This will shift the operating frequency to higher frequencies.

The preferred embodiment operates to shift the operating frequency to higher frequencies where 1/f noise is smaller and/or to a particular frequency to take advantage of the increased sensitivity of sensors at particular frequencies. Magnetoelectric sensors have increased sensitivity at their mechanical resonant frequency $f_r$. For example, when detecting a low frequency signal $f_s$, the coil is driven at $f_m$ and sidebands appear at $f_m \pm f_s$. We can pick the modulation frequency $f_m$ driving the magnetic material into and out of saturation so that one of the sidebands is at the resonant frequency, i.e., $$f_r = f_m - f_s \text{ or } f_r = f_m + f_s \quad (1)$$

This permits one to take advantage of the increased sensitivity of magnetoelectric sensors at the mechanical resonant frequency.

Figure 2:
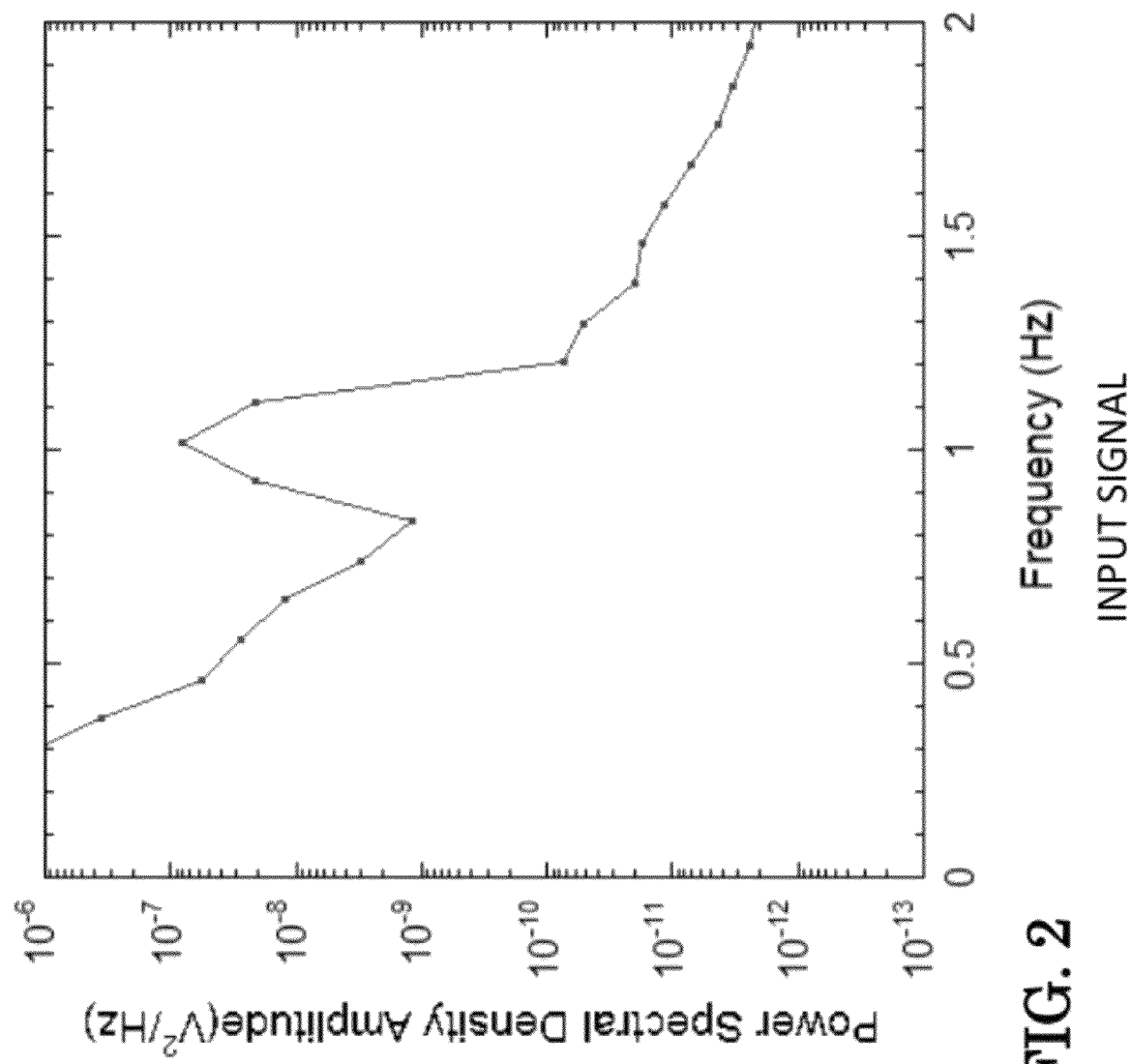
FIG. 2 illustrates graphically a power spectrum showing an inputted signal (directly detected) of a 0.0162 Oe. field at 1 hertz.
Figure 3:
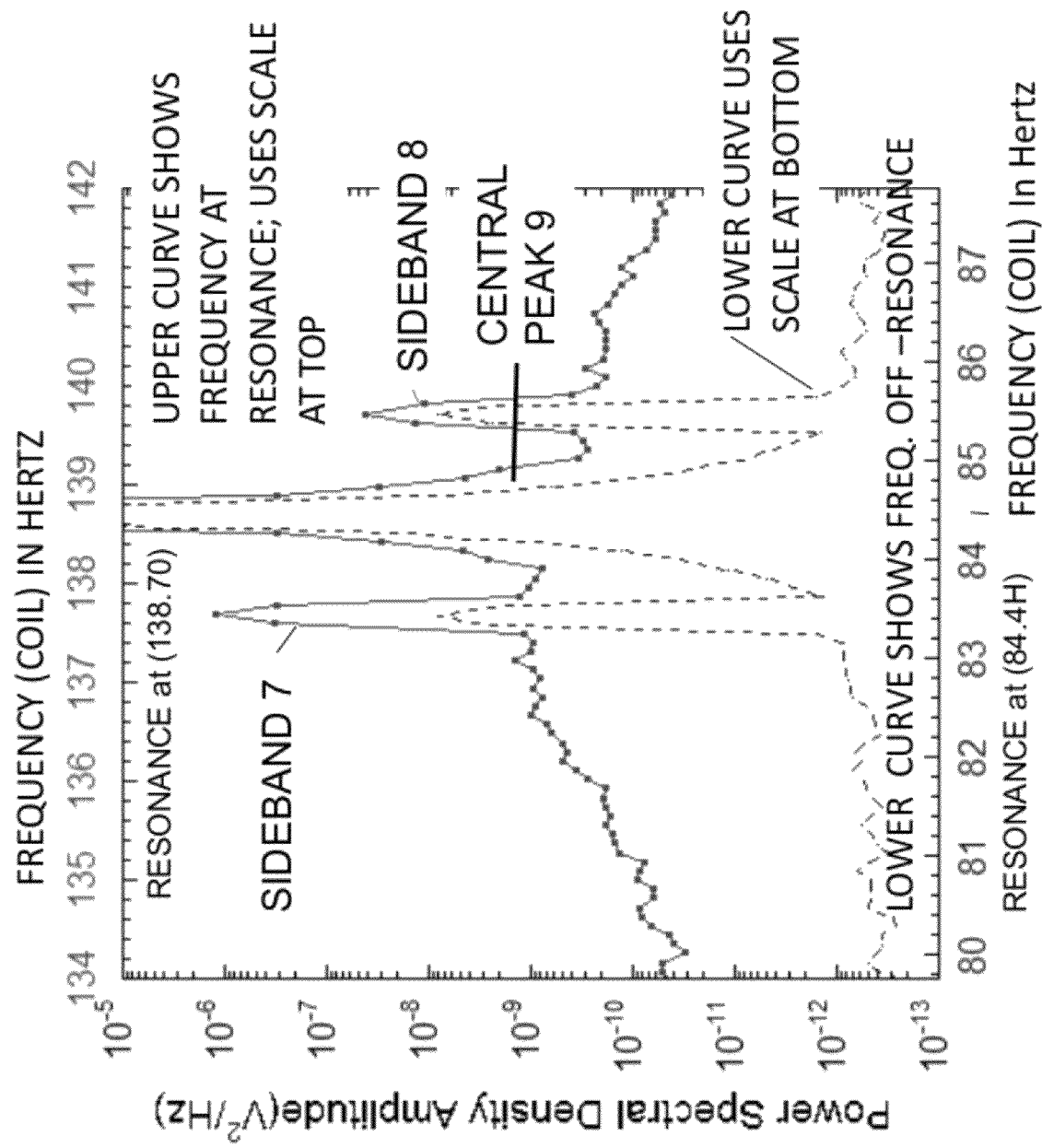
FIG. 3 is a graphical illustration of a power spectrum showing, inter alia, the sidebands of the signal due to field modulation. The frequencies shown are the frequencies at which the coil 6 was driven. The central peak reflects the modulation input.

An increased signal to noise ratio has been demonstrated using this invention. FIG. 3 graphically shows the results. The sensor was an asymmetric magnetoelectric sensor with a Ni bias layer. As depicted in FIG. 2, the inputted signal was a 0.0162 Oe field at 1 Hz. The additional applied fields were applied by a coil 6 in FIG. 1. These fields were an additional DC bias field of 4.6 Oe and an AC field with an amplitude of 3.6 Oe. The detection of the direct 1 Hz signal is shown in FIG. 2. One sees that the signal to noise ratio is about 2.5 orders of magnitude. The input signal may be inputted into the preferred embodiment from the left as shown in FIG. 1. FIG. 3 shows two cases of field modulation. The first is the blue curve with the frequency scale at the bottom of the figure. The modulation frequency in this case is 84.3 Hz and the sidebands are not at the resonant frequency of the sensor. In this case, the signal to noise ratio is about 4 orders of magnitude.

Optimally, the modulation frequency is chosen so that one of the sidebands is at the mechanical resonant frequency of the sensor. The modulation frequency was chosen so that the frequency of the lower frequency sideband satisfied Eq. 1. The lower frequency sideband is increased in amplitude because it is at the resonant frequency. One can see in FIG. 3 that the lower frequency sideband is enhanced by more than a factor of 10 in comparison with the upper frequency sideband. Without demodulation the signal to noise ratio is 3 orders of magnitude. Thus, in both cases using the large field modulation increases the signal to noise ratio. If demodulation permitted the decrease in the background to that of the blue curve, the signal to noise ratio using the low frequency sideband will be 6 orders of magnitude.

Figure 4:
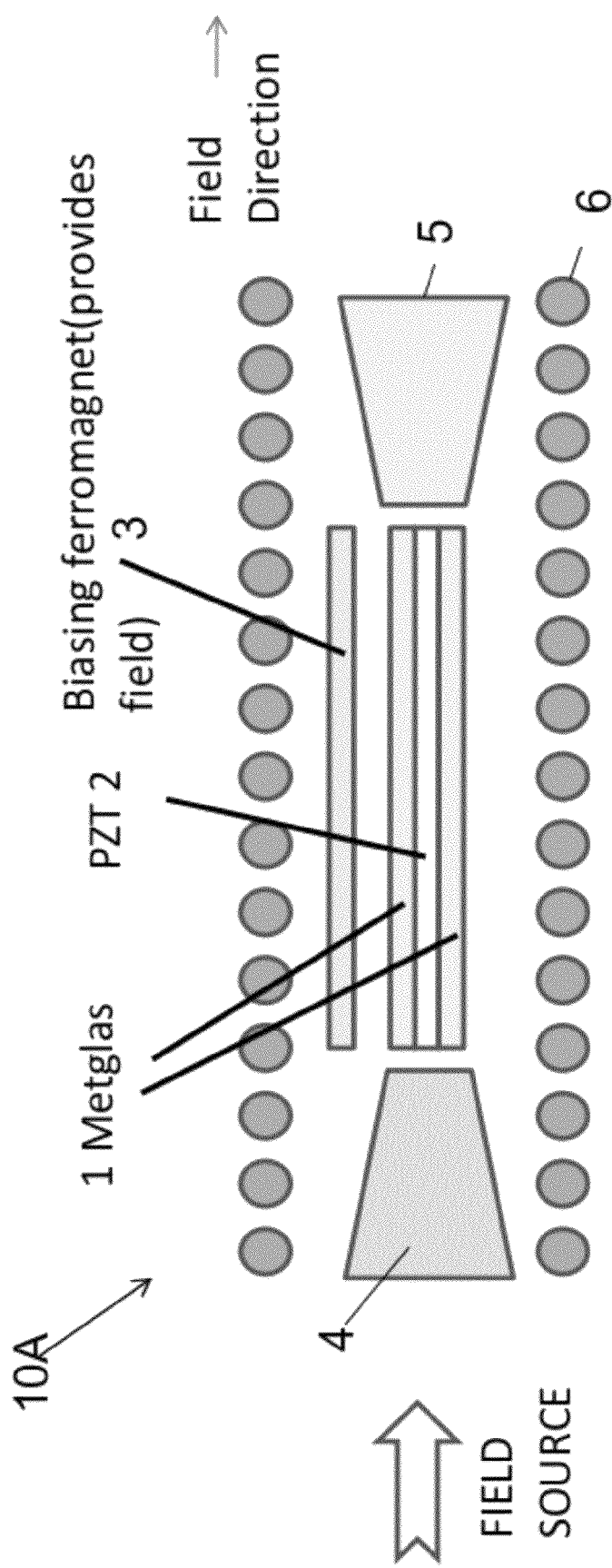
FIG. 4 is a schematic drawing of a preferred embodiment comprising a magnetoelectric sensor 10A comprising two magnetostrictive layers 1 surrounding a piezo fiber layer 2.

The preferred embodiment of FIG. 4 comprises an intermediate piezoelectric layer 2 sandwiched between two magnetostrictive layers (such as for example, Metglas® layers) 1 to form a symmetrical assembly. From FIG. 4 it can be seen that the biasing ferromagnetic layer 3 is not connected to the layer 1. The embodiment of FIG. 4 is a composite laminate, formed of one piezo-fiber layer 2 arranged between two high-permeability magnetostrictive alloy layers 1, such as FeBSiC. The fiber layers 2 may, for example, be PZT-5A ceramic fibers, PMN-PT or PZN-PT single crystal fibers, or equivalent. An illustrative example fiber thickness may, for example, be approximately 350 µm and the Metglas® layers may have, for example, a thickness of 25 µm. One example arrangement is one piezoelectric PZT fiber layer between two high permeability magnetostrictive layers. A plurality of alternating symmetric units connecting to at least one of the piezoelectric fiber layers may be used with the number of magnetostrictive layers exceeding the piezo-fiber layers by one.

Figure 5:
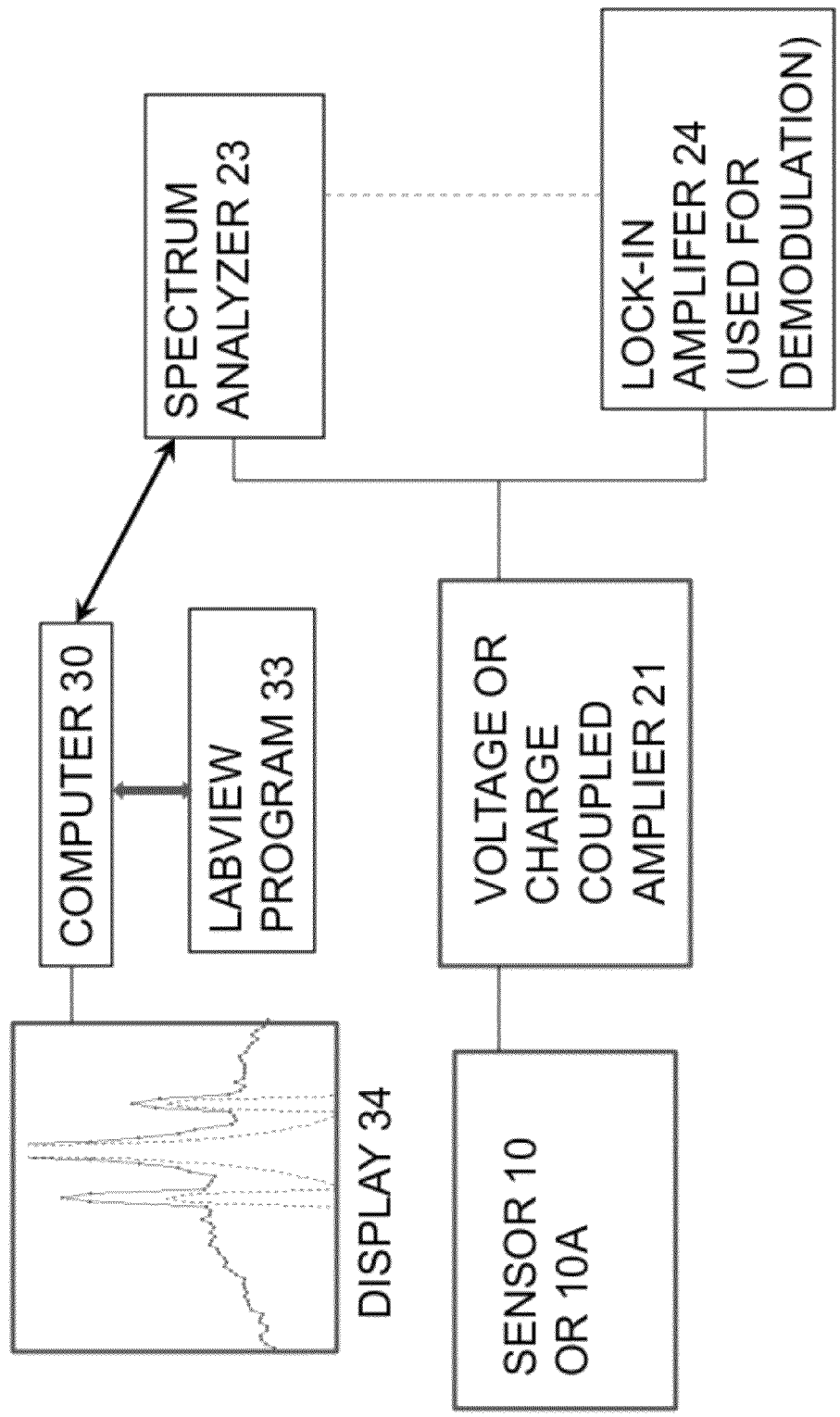
FIG. 5 is a schematic drawing of a preferred embodiment comprising a magnetoelectric sensor 10 or 10A operatively connected to a voltage or charge coupled amplifier 21. The amplifier 21 is operatively connected to a spectrum analyzer 23 and lock-in amplifier 24.

FIG. 5 is a schematic drawing of a preferred embodiment comprising a magnetoelectric sensor 10 or 10A operatively connected to a voltage or charge coupled amplifier 21. The amplifier 21 is operatively connected to a spectrum analyzer 23 and lock-in amplifier 24. The spectrum analyzer 23 is controlled via a custom Labview® program in computer 30, although any program which accomplishes the tasks would also be within the scope of the present invention. The output of the computer 30 is displayed on a display screen 34. The display may show results such as in FIG. 3. The lock-in amplifier 24 can be used to demodulate the signal and the demodulated signal may be fed into the spectrum analyzer 23 and then back into computer 30. The display may show results such as in FIG. 10.

The present invention provides a method for increasing the operating frequency of centimeter sized magnetic sensors to decrease the problem of 1/f noise and/or for taking advantage of a specific frequency where the sensor has improved performance. This invention solves these problems by applying an AC field at a frequency $f_m$ that drives at least one of the magnetic components of the sensors into and out of magnetic saturation or a region of increased magnetic response. In the case of magnetoelectric (ME) sensors, these components are the flux concentrator, possibly the biasing magnet used to bias the magnetostrictive material, and the magnetostrictive material. The way magnetoelectric (ME) sensors operate is as follows. In the presence of a magnetic field, the magnetostrictive material applies a stress to a piezoelectric material which then generates a charge. Magnetoelectric sensors have a factor of 10 increased sensitivity at their mechanical resonant frequency $f_r$. By driving the magnetic material into and out of saturation, one modulates the sensitivity of magnetoelectric sensors. If the signal to be detected is at a frequency $f_s$, a small coil may be utilized to apply a several Oe ac field at frequency $f_m$. This will enable observation of sidebands at frequencies $f_m \pm f_s$. One can adjust $f_m$ so that one of the sidebands is at the resonant frequency of the sensor where the sensor is more sensitive. Thus, the invention of using a coil in this way both mitigates 1/f noise by increasing the operating frequency and takes advantage of the increased sensitivity at $f_r$.

Figure 6:
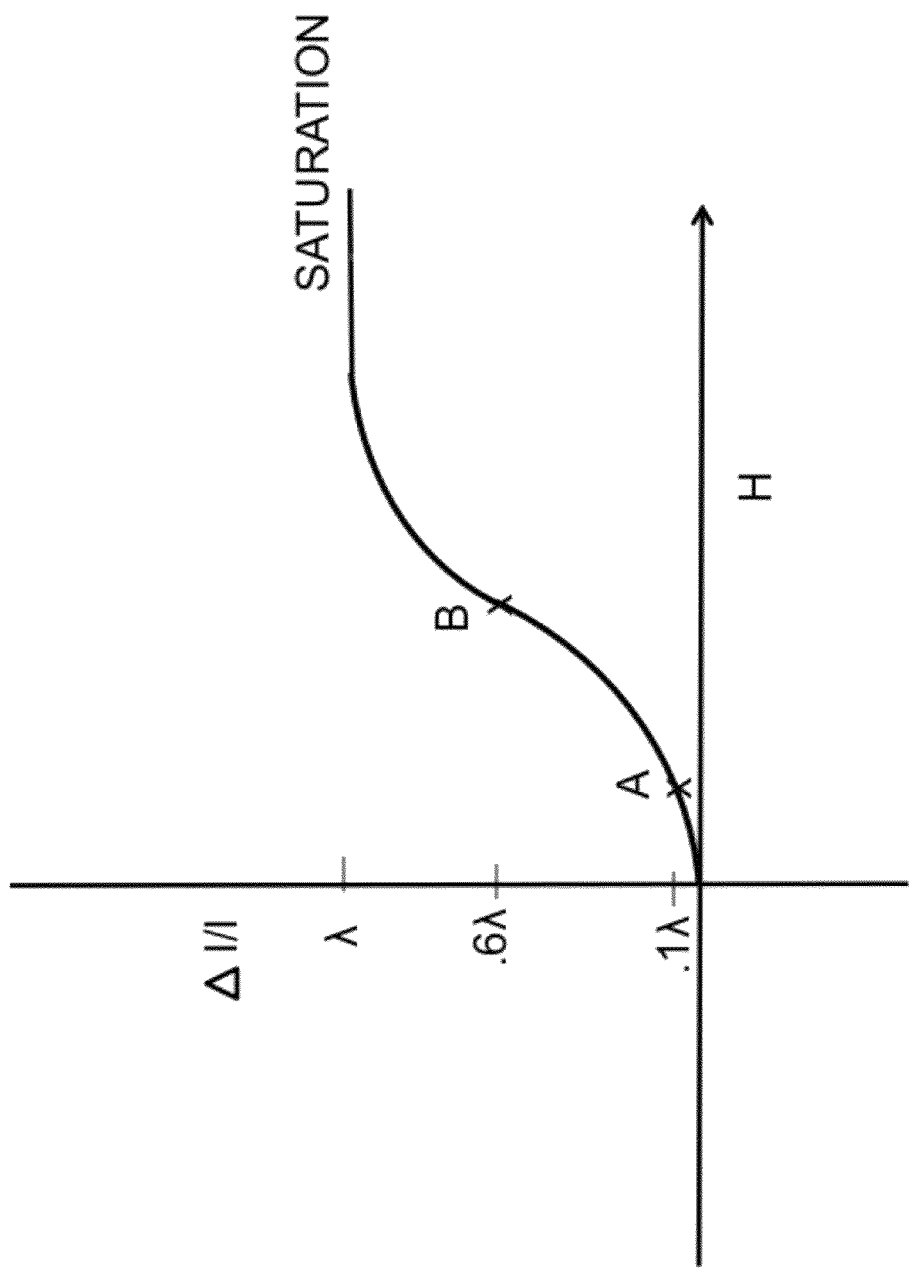
FIG. 6 is a schematic graph of magnetostriction deformation $\delta l/l$ (change in length divided by length) as a function of field intensity.

FIG. 6 is a schematic graph of magnetostriction deformation δl/l as a function of field intensity. Magnetostriction occurs when the shape of a ferromagnetic material or element changes during the magnetization process. Magnetostriction causes deformation δl/l, which may be in the range of $10^{-5}$ to $10^{-6}$. The deformation δl/l increases with increasing field intensity as shown in FIG. 6, and reaches saturation at λ. The region of increased magnetic response occurs when the modulation changes the operating point between regions where the slope of the δl/l (magnetostriction deformation) versus magnetic field graph is small to regions where the slope is large. With reference to FIG. 6, given that λ is the value at which saturation occurs, the slope is relatively small at Point A where the deformation δl/l is approximately 0.1λ and is relatively large at Point B where the deformation δl/l has a value of approximately 0.6λ. Consequently, for example, signal modulation around the operating point of approximately 0.35λ would generate an amplitude modulated signal. As a function of frequency, the signal would appear as sidebands around the modulation frequency. The selection of the region of operation would also be dependent upon the signal to noise ratio remaining low. Thus, this modulation allows the shifting of operation frequency which can have the benefit of decreasing the 1/f noise or moving to a frequency where the sensor is more sensitive.

A preferred method comprises applying a time varying magnetic field, for increasing the operating frequency of ME sensors that incorporates the nonlinearity response of magnetostrictive materials. In its simplest form, for itinerate systems, this response is given by $$\frac{\Delta V}{V} = \frac{V_K}{2D\mu_B^2} \frac{\partial \ln D}{\partial \ln V} M^2 \qquad (1)$$

where V, K, D, and M are volume, the isothermal compressibility, the electronic density of states at the Fermi energy, and the magnetization density, respectively. We shall consider the case where M is proportional to the field H and take $$H(t) = H_s \sin \omega_s t + H_m \sin \omega_m t, \ H_s << H_m \qquad (2)$$

where $H_s$, $H_m$, $\omega_s$, and $\omega_m$ are the magnetic signal amplitude to be measured, the magnetic modulation amplitude, signal frequency, and modulation frequency, respectively. Substituting Eq. (2) into Eq. (1), one finds that there will be a cross term in the magnetostrictive response of the form $H_s H_m \sin \omega_s t \sin \omega_m t$. The transfer of this strain to the piezoelectric layer(s) creates sidebands in the ME output at $\omega_m \pm \omega_s$ with amplitudes proportional to $H_s H_m$.

A coil surrounding the ME sensors was used to generate AC modulation fields directed along the measurement direction of the sensors. We investigated both a symmetric and asymmetric ME sensor. In this embodiment, the symmetric sensor consisted of a layer of longitudinally poled lead zirconate titanate (PZT) sandwiched between layers of Metglas (Vitrovac 7600F, Vitrovac Inc. Hanau, German) of length 8 cm and width 1 cm. The PZT core is a planar bundle of 5 PZT fibers, each with dimensions of 40×2×0.2 mm. The asymmetric sensor, that had dimension 6 cm×1 cm×0.5 cm, was self-biased (as describe further in S. K. Mandal, et al., "Flexural Deformation in a Compositionally Stepped Ferrite and Magnetoelectric Effects in a Composite with Piezoelectrics," Appl. Phys. Lett., 2010: p. 192502 and S. K. Mandal, et al., "Magnetization-graded Multiferroic Composite and Magnetoelectric Effects at Zero Bias," Phys. Rev. B 84, 014432 (2011), both of which are incorporated by reference) and consisted of three layers of 25-µm Metglas/200-µm nickel/300-µm PZT, all mechanically coupled with epoxy. Electrical leads were silver-epoxied to the PZT, which was poled perpendicular to the length of the laminate. It was fixed at one end in a cantilever configuration. The Ni provided a field to bias the ME sensor.

The measuring system consisted of a set of Helmholtz coils, powered by an Agilent 33220A signal generator that was used to apply a sinusoidal, time varying field $H_s$ along the longitudinal axis of the sensor. In these experiments, no flux concentrators were employed, although the system may optionally include flux concentrators. The signal was detected first using a charge coupled amplifier, PCB Piezotronics Model 441A101, and then filtered in a SR640 low-pass filter with no gain before being sent either to a spectrum analyzer that uses a LabVIEW VI program or to a SR830 DSP Lock-In Amplifier. Resonance frequencies for each cantilever setup were obtained by sweeping the frequency of a 0.0162 Oe external field at progressively finer intervals around the peak value. All the measurements were conducted in our laboratory without the benefit of magnetic, electric, and thermal shielding. Acoustic isolation was provided by a Hertz DT-M vibration isolator.

Figure 7A:
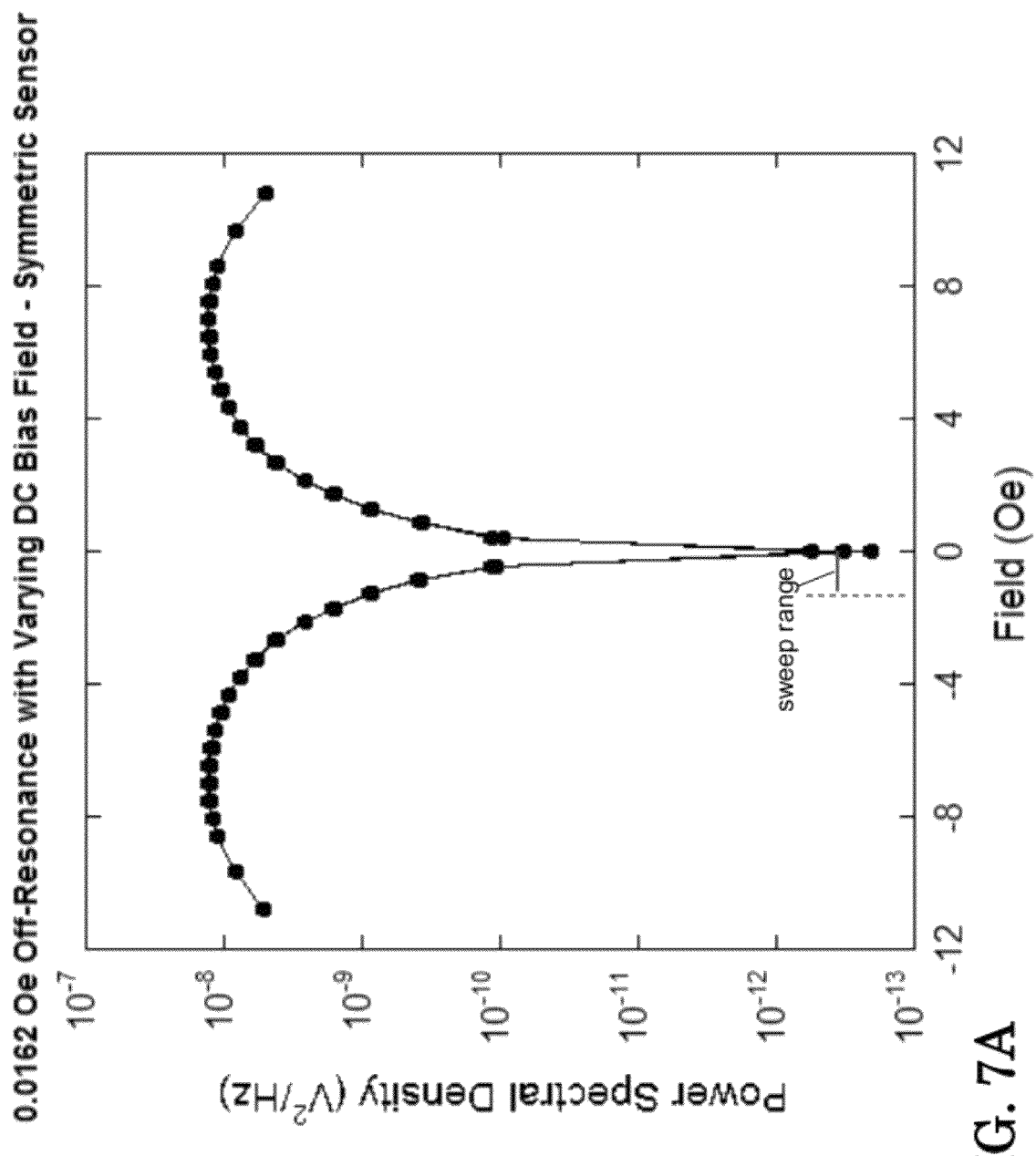
FIG. 7A graphically illustrates the symmetric ME sensor response after applying a signal field $H_s$ of 0.0162 Oe at 140 Hz and a DC bias field from the surrounding coil as a function of DC bias field.
Figure 7B:
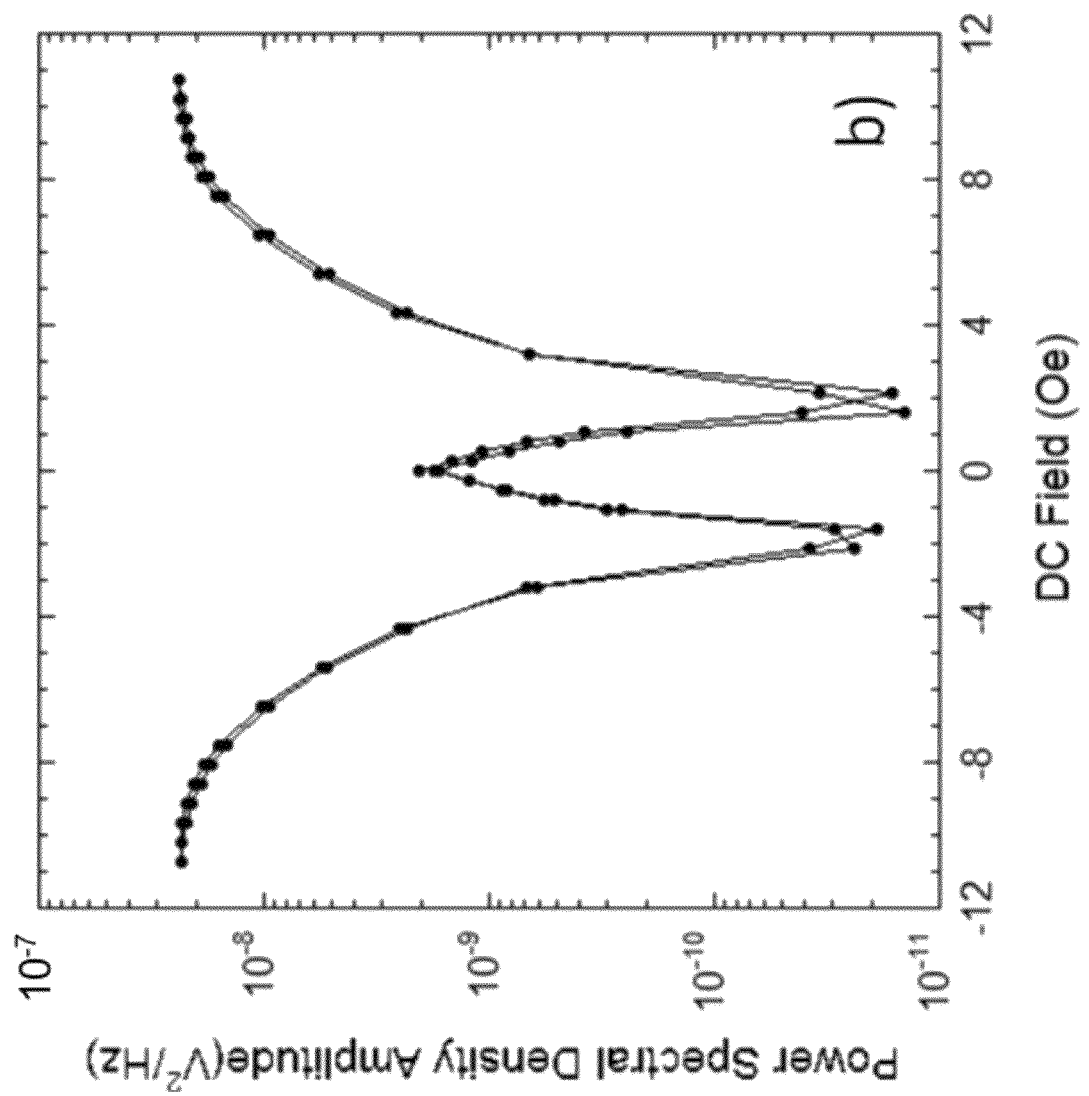
FIG. 7B graphically illustrates the asymmetric ME sensor response after applying a signal field $H_s$ of 0.0162 Oe at 140 Hz and a DC bias field from the surrounding coil as a function of DC bias field.

The ME response after applying a signal field $H_s$ of 0.0162 Oe at 140 Hz and a DC field from the surrounding coil as a function of a DC bias field is shown in FIGS. 7A and 7B for, respectively, the asymmetric and symmetric sensors. Both responses are strongly dependent on the DC field and are approximately symmetric functions of this bias. The asymmetric sensor was designed to have a local maximum sensitivity at zero DC field due to the residual magnetism of the Ni adjacent to the Metglas. The magnetic properties of this Ni layer makes the ME response to an additional applied field more complicated. To modulate the sensor optimally, the magnitude of the AC modulation field $H_m$ was chosen so that the ME output of the sensor at a fixed field oscillated between its minimum value and a much larger value.

Figure 8:
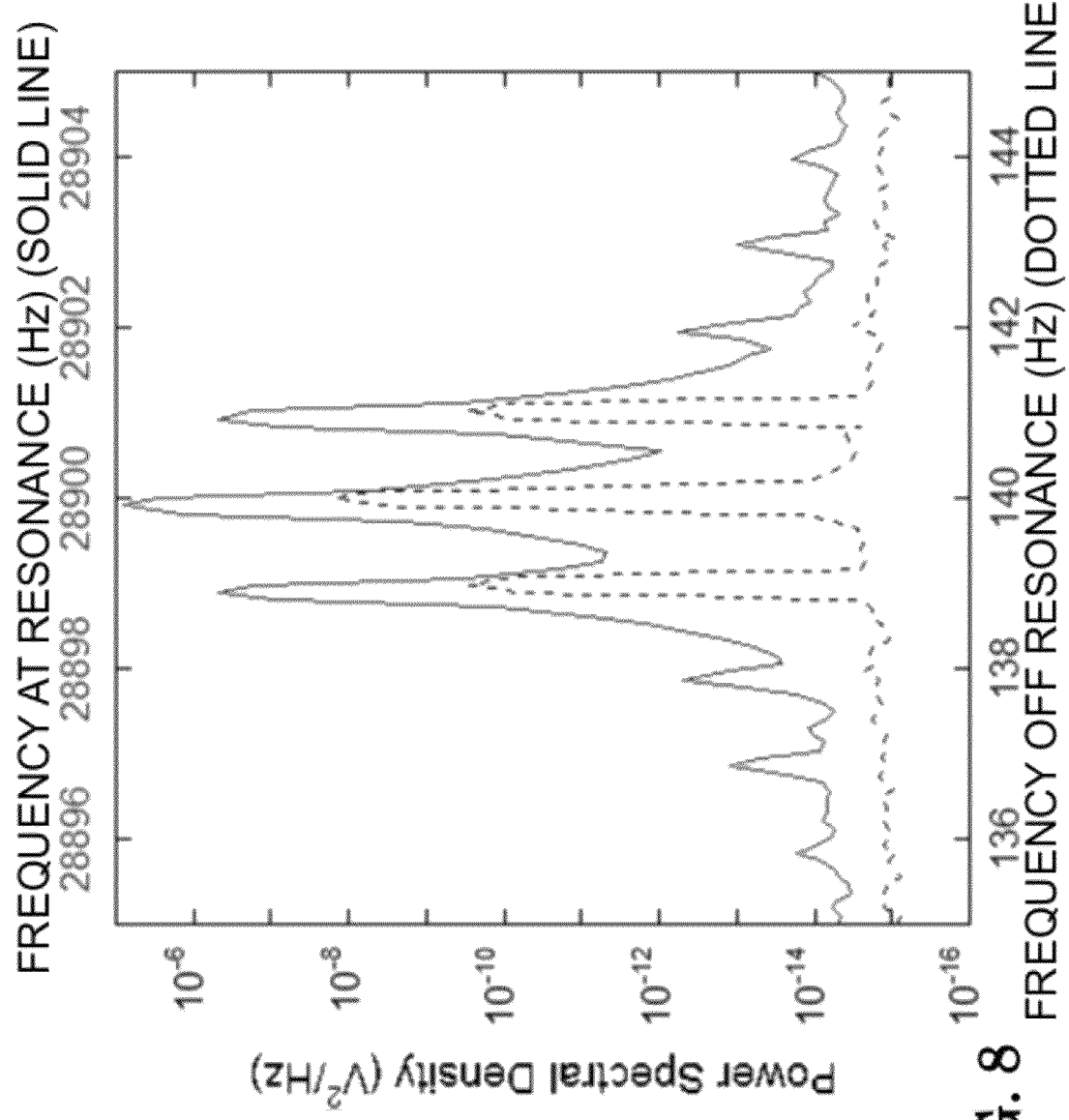
FIG. 8 graphically illustrates the power spectra from the symmetric sensor detecting a 1.019 Hz, 0.0162 Oe field while modulating the sensor with a 0.72 Oe field either off resonance at 140 Hz (dashed curve) or on resonance at 28.9 k Hz (solid curve, top x-scale).
Figure 9:
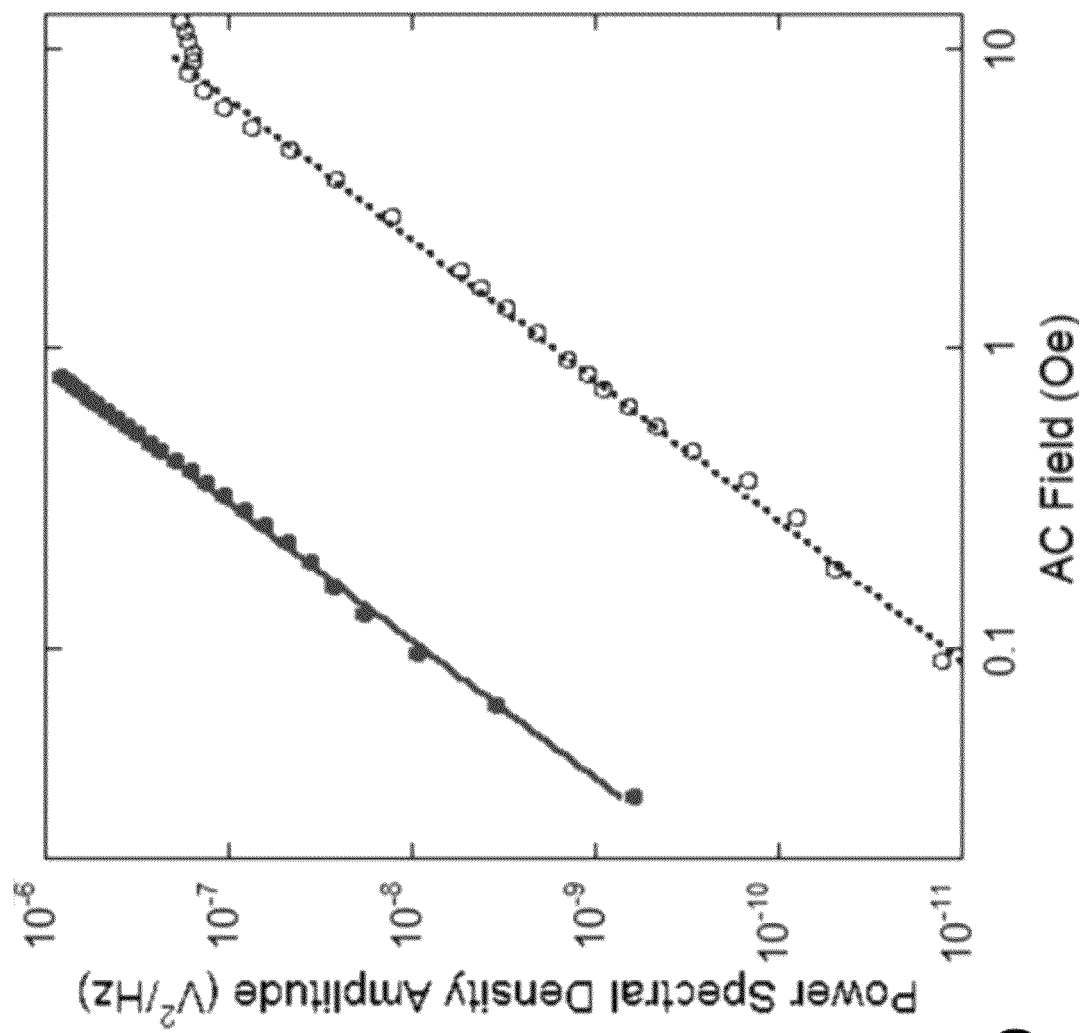
FIG. 9 illustrates the sideband amplitude as a function of the signal field at 1.019 Hz in the cases of being off resonance at 140 Hz (dashed curve) or on resonance at 28.9 kHz (solid curve).

FIG. 8 shows the output power spectrum of the symmetric sensor in which an AC modulation field $H_m$ was applied at two different frequencies. In both cases, $H_m$ was 0.72 Oe and the signal field $H_s$ was 0.0162 Oe at 1.019 Hz. In the first case, the AC field was applied at 140 Hz. One sees three main peaks corresponding to the modulation frequency $f_m$ and the two sidebands $f_m \pm f_s$. In the second case, the modulation frequency was chosen so that the $f_m - f_s$ sideband was equal to the longitudinal resonant frequency of the sensor, 28.9 kHz. In this case, all the peaks, including the additional sidebands due to the anharmonicity of the sensor, were enhanced by the increased sensitivity of the sensor around the resonance frequency. The amplitude of the side band in the power spectrum versus $H_m$ is shown FIG. 9. Both the cases of being on and off resonance are shown. One sees that in either case, the output, as discussed above, is proportional to $H_m$ and the power spectrum is proportional to $H_m^2$. Note that in the off resonance case the output deviates from being proportional to $H_m^2$ at high values. Since the background around the modulation frequency increases rapidly at higher values of $H_m$, there is an optimum value of $H_m$ for maximizing the signal to noise ratio.

Figure 10:
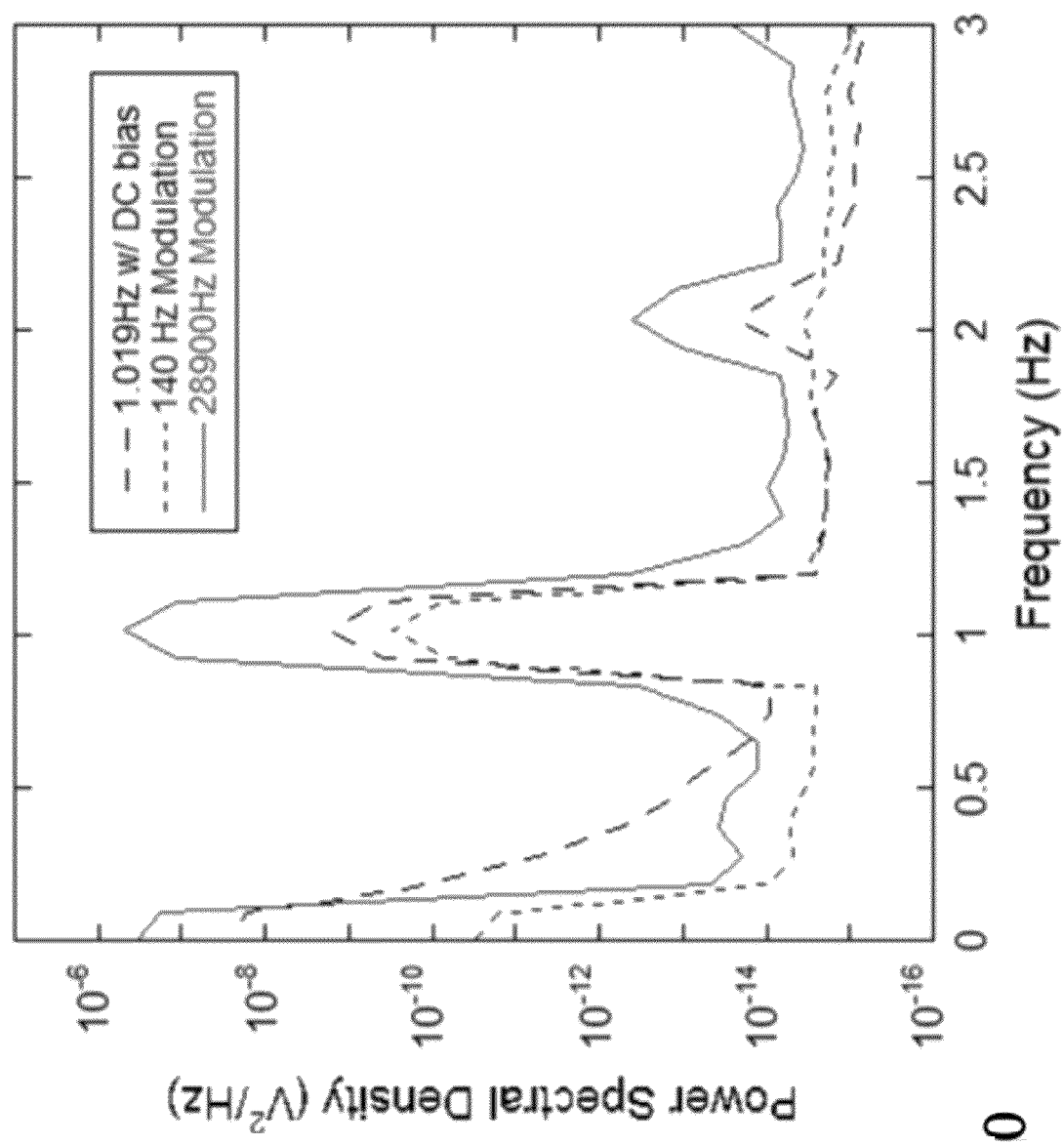
FIG. 10 illustrates the power spectra from the symmetric sensor detecting a 1.019 Hz, 0.0162 Oe field with the direct signal (curve with long dashes), the demodulated signal after modulating off resonance at 140 Hz (curve with short dashes), and the demodulated signal after modulating on resonance at 28.9 kHz (solid curve).
Figure 11:
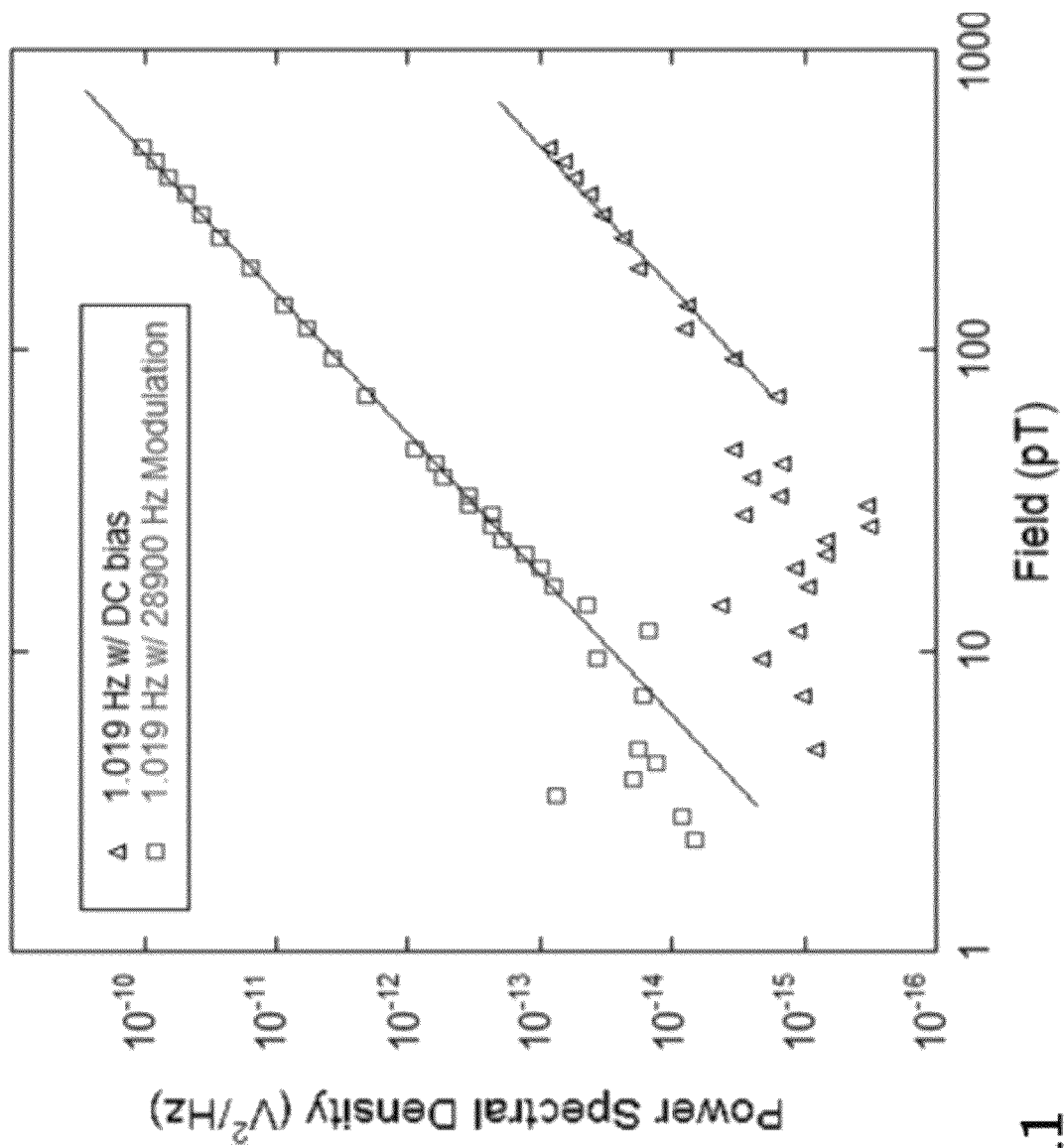
FIG. 11 graphically illustrates a comparison of the direct signal (triangles) and the demodulated sideband signal (squares) from the symmetric ME sensor at resonance as a function of signal field at 1.019 Hz.

FIG. 10 shows a comparison of the sensor's direct output power spectrum using a DC bias field of 0.72 Oe and the demodulated signals at the two frequencies discussed above. One sees there is approximately a two orders of magnitude increase in the signal to noise ratio when the sideband frequency is equal to the resonant frequency of the sensor. In FIG. 11, the direct output from a 1.019 Hz signal field with a DC bias of 1.06 Oe and the demodulated output from a 1.06 Oe modulation field at 28.9 k Hz are plotted as a function of $H_s$. In the modulated case no DC bias was employed. One sees an increase in field detectivity of the symmetric sensor of a factor of 10 obtained by the modulation technique. The sensor was capable of detecting a 7 pT/$\sqrt{Hz}$ field at 1 Hz in a magnetically unshielded environment.

The invention may be utilized at a security check point to detect unapproved transport of banned items, as part of a sensor in an unattended ground sensor network, to control manufacturing processes, to check the proper functioning of the hearts of babies before birth, and with drugs containing nanomagnets for monitoring of the dissemination of drugs in the body of patients using sensors.

The advantages of the present invention are that one can operate the sensor at a frequency where its sensitivity is higher and the 1/f noise is lower. Results have been obtained using 5 cm long asymmetric magnetoelectric sensors.

As used herein the terminology "saturation" means the state reached when an increase in applied external magnetizing field H cannot increase the magnetization of the material further, so the total magnetic field B levels off. In the context of the magnetization curve of a substance, it is manifested as a bending to the right of the curve. As the H field increases, the B field approaches a maximum value asymptotically; i.e., the saturation level for the substance. Above saturation, the B field continues increasing, but at the paramagnetic rate, which is 3 orders of magnitude smaller than the ferromagnetic rate seen below saturation. The relation between the magnetizing field H and the magnetic field B is the magnetic permeability: $\mu = B/H$. In saturable materials the permeability increases with H to a maximum, then as it approaches saturation inverts and decreases toward zero.

Although various preferred embodiments of the present invention have been described herein in detail to provide for complete and clear disclosure, it will be appreciated by those skilled in the art, that variations may be made thereto without departing from the spirit of the invention.

It should be emphasized that the above-described embodiments are merely possible examples of implementations. Many variations and modifications may be made to the above-described embodiments. All such modifications and variations are intended to be included herein within the scope of the disclosure and protected by the following claims.

The invention claimed is:

1. A modulating magnetic field sensor device comprising:
   a base;
   a magnetic sensor operatively associated with the base for sensing a magnetic field; the magnetic sensor comprising a plurality of magnetic components;
   at least one coil for creating a magnetic field around the magnetic sensor; the at least one coil adapted to be connected to an alternating current source; the alternating current passing through the coil operating to modulate the magnetic field at the magnetic sensor and drive at least one of the magnetic components of the magnetic sensor into and out of its region of increased magnetic response while shifting the frequency of the magnetic field that is sensed by the magnetic sensors to a higher frequency to thereby minimize 1/f-type noise, where f is the frequency of operation of the magnetic sensor.

2. The device of claim 1 wherein as a result of driving at least one of the magnetic components into and out of its region of increased magnetic response results in a power spectrum of $V^2/Hz$ versus frequency revealing sidebands around the peak at the modulation frequency, at least one of the sidebands having a signal to noise ratio greater than that of the original signal, and wherein the sidebands indicate the intensity of the electromagnetic field sensed by the sensor.

3. The device of claim 2 wherein the signal outputted by the magnetic sensor is anharmonic such a plurality of sidebands appear in the power spectrum of $V^2/Hz$ versus frequency, the sidebands having an improved signal to noise ratio and when the sidebands are demodulated the signal to noise ratio is greater than the original signal such that the sensitivity is improved by at least ten percent.

4. The device of claim 2 wherein the modulation frequency is adjusted such that one of the sidebands is at the resonant frequency of the sensor resulting in an enhanced signal because of the increased sensitivity at the resonant frequency.

5. The device of claim 1 wherein the magnetic sensor comprises a piezoelectric layer and wherein the piezoelectric layer is operatively connected to either a voltage amplifier or charge coupled amplifier and the output of the amplifier is operatively connected to signal processing electronics which displays the power spectrum of $V^2/Hz$ versus frequency.

6. The device of claim 1 wherein the magnetic components of the magnetic sensor comprise at least one layer of magnetostrictive material.

7. The device of claim 1 wherein the magnetic components of the magnetic sensor comprise a layer comprising predominantly magnetostrictive material and a layer comprising predominately ferromagnetic material.

8. The device of claim 1 wherein the at least one coil comprises first and second coils, the first and second coils having different currents, the first coil having a DC current which creates a substantially constant magnetic field, the second coil comprising a modulating current which drives at least one of the magnetic components into and out of saturation.

9. The device of claim 1 further comprising at least one flux concentrator on one side of said magnetic sensor.

10. The device of claim 1, wherein the at least one flux concentrator comprises a pair of flux concentrators a fixed distance apart.

11. The sensor of claim 1 wherein the at least one flux concentrator is not attached to the magnetic sensor.

12. The sensor of claim 1 wherein the at least one flux concentrator comprises a support layer and a layer of a soft magnetic material which absorbs magnetic flux.

13. The sensor of claim 1 wherein the at least one flux concentrator has a first cross sectional area where magnetic flux may enter and a second cross sectional area from where magnetic flux may transfer onto the magnetic sensor and wherein the ratio of the first cross sectional area to the second cross sectional area is greater than or equal to 1.5 and less than 15.

14. The sensor of claim 1 wherein when an alternating current is applied to the coil at a prescribed frequency, it operates to modulate the magnetic field at the magnetic sensor and shift the frequency of the magnetic field that is sensed by the magnetic sensor to a higher frequency to thereby minimize 1/f-type noise of the magnetic transducer and wherein, at a predetermined input to the coil, the magnetic sensor oscillates at approximately its resonant frequency.

15. The sensor of claim 1 wherein the magnetic sensor is operatively connected to a low noise amplifier which increases the intensity of the signal outputted by the transducer.

16. The sensor of claim 1, wherein the sensor has a mass and has a natural resonant frequency; and wherein the at least one coil that is adapted to be connected to an alternating current source causes the sensor to move substantially at the resonant frequency.

17. The sensor of claim 1, wherein the sensor comprises one of a magnetoresistive sensor, a magnetoelectric sensor, and a magneto-optical sensor, chip-scale atomic magnetometer.

18. A method of operating a magnetic sensor comprising:
forming at least one coil around the magnetic sensor; the magnetic sensor comprising a layer comprising piezoelectric material and one or more layers of a magnetostrictive material;
connecting the at least one coil to an alternating current power source; the power source causing the sensor to move substantially at the resonant frequency;
modulating the current from the power source to drive at least one of the magnetic sensor components into and out of saturation.

19. The method of claim 18 wherein the magnetic sensor components comprise at least one layer of ferromagnetic material.

20. A method of operating a magnetic sensor comprising:
forming at least one coil around the magnetic sensor;
connecting the at least one coil to an alternating current power source;
modulating the current from the power source to drive at least one of the magnetic sensor components into and out of saturation;
wherein the signal outputted by the sensor comprises sidebands and wherein the sidebands indicate the intensity of the electromagnetic field sensed by the sensor.

* * * * *